United States Patent [19]

Palagonia

[11] Patent Number: 5,751,057
[45] Date of Patent: May 12, 1998

[54] LEAD ON CHIP LEAD FRAME DESIGN WITHOUT JUMPOVER WIRING

[75] Inventor: Anthony Michael Palagonia, Underhill, Vt.

[73] Assignee: International Business Machines Corporation, Armonk, N.Y.

[21] Appl. No.: 728,534

[22] Filed: Oct. 9, 1996

Related U.S. Application Data

[63] Continuation of Ser. No. 526,254, Sep. 11, 1995, abandoned.

[51] Int. Cl.⁶ .................... H01L 23/52; H01L 23/495
[52] U.S. Cl. .................. 257/691; 257/666; 257/692; 257/776; 257/784
[58] Field of Search ........................... 257/691, 692, 257/784, 666, 676, 776

[56] References Cited

U.S. PATENT DOCUMENTS

| | | | |
|---|---|---|---|
| 5,229,639 | 7/1993 | Hansen et al. | 257/691 |
| 5,250,840 | 10/1993 | Oh et al. | 257/666 |
| 5,252,853 | 10/1993 | Michii | 257/691 |
| 5,252,854 | 10/1993 | Arita et al. | 257/676 |
| 5,286,999 | 2/1994 | Chiu et al. | 257/666 |
| 5,311,058 | 5/1994 | Smolley | 257/691 |
| 5,358,904 | 10/1994 | Murakami et al. | 437/209 |
| 5,359,224 | 10/1994 | Heinen et al. | 257/691 |
| 5,365,113 | 11/1994 | Sakuta et al. | 257/786 |
| 5,394,008 | 2/1995 | Ito et al. | 257/691 |
| 5,428,247 | 6/1995 | Sohn et al. | 257/691 |
| 5,442,233 | 8/1995 | Anjoh et al. | 257/691 |
| 5,461,255 | 10/1995 | Chan et al. | 257/691 |
| 5,473,190 | 12/1995 | Inoue et al. | 257/691 |

*Primary Examiner*—Tom Thomas
*Assistant Examiner*—David Ostrowski
*Attorney, Agent, or Firm*—Schmeiser, Olsen & Watts; Mark F. Chadurjian

[57] ABSTRACT

Lead On Chip ("LOC") leadframe designs for thin, small-outline packages having improved configurations of lead-frame members are provided. The LOC leadframes comprise a bus bar, having at least one distribution finger, and a plurality of lead fingers arranged in such a manner that jump-over is eliminated, thus increasing the reliability of the package.

20 Claims, 2 Drawing Sheets

LEAD ON CHIP LEAD FRAME DESIGN WITHOUT JUMPOVER WIRING

This application is a continuation of application Ser. No. 08/526,254, filed Sep. 11, 1995, now abandoned.

BACKGROUND OF THE INVENTION

1. Technical Field

This invention generally relates to semi-conductor manufacturing. In particular, this invention relates to Lead On Chip packaging technology and an improved configuration of leadframe members (e.g. castellated bus bars) which are arranged such that no jump-overs are required.

2. Background Art

Lead On Chip (hereinafter "LOC") packaging technology entails interconnecting leadframe members to chip pads by means of bond wire interconnects. Historically, these chip pads have been generally arranged in parallel lines that are centrally located on the chip with bus bars running parallel to and outside of the chip pads. Therefore, in order to interconnect the chip pads to the leadframe members, the bond wires have had to jump over the bus bars. See e.g. U.S. Pat. No. 5,250,840 (showing a single row of chip pads with the bus bars running parallel the chip pads and between a row of pads and the individual lead fingers); and U.S. Pat. No. 5,358,904 (disclosing several embodiments in which the wire interconnects jump over the bus bars). Should a bond wire become deformed during processing, it could physically contact the bus bar, thereby causing a short circuit. Various arrangements for reducing this possibility have been suggested including the placement of the bus bars between the chip pads and the placement of the bus bars under the leadframe fingers.

U.S. Pat. No. 5,358,904, entitled "Semiconductor Device," by Murakami et al., issued Oct. 25, 1994, and assigned to Hitachi, Ltd., relates to package structures for lead-on-chip semiconductor packages and the method for producing them so as to increase the speed of signal transmission by reducing the stray capacity and electrical noise and to increase productivity, in part by moving the bus bars between the chip pads.

U.S. Pat. No. 5,268,999, entitled "Folded Bus Bar Leadframe," by Chiu, issued Feb. 15, 1994, and assigned to Texas Instruments Inc., relates to a leadframe in which the bus bar runs underneath and perpendicular to the lead fingers, which are specially etched in order to minimize the height of the leadframe and, hence, loop height. The bus bars are insulated from the lead fingers by a specially shaped insulating tape having fingers. See also U.S. Pat. No. 5,252,854. All of the references disclosed herein are hereby incorporated by reference.

As described in the above-cited patents, alternatives to the traditional leadframe design have been found in attempts to reduce the likelihood of a short circuit occurring because of the jump-over problem. However, the above references do not adequately address the reliability and cost-effectiveness problems involved with LOC packaging. Although the bond wire interconnects no longer jump over the bus bars, problems with short circuiting remain in view of the following: 1.) the loop height required by the present methods of layering the leadframes and bus bars allows the loops to become bent over the edge of the lead fingers, causing them to come into contact with the bus bar beneath and short; 2.) the necessary additional layers of insulation, each having different thermal properties, cause package breakdowns during standard stress tests, especially during the heat cycle; and 3.) the area provided for the stitch bond of the bond wires to the bus bar is inadequate for the present alignment of the chip pads. Therefore, there existed a need to provide a leadframe configuration that would minimize shorts, have improved stress properties, and improved area for the stitch bond, thus improving overall reliability of the leadframe.

SUMMARY OF THE INVENTION

In accordance with the present invention, an LOC leadframe is disclosed having bus bars, which comprise at least one distribution finger, and lead fingers arranged in such a manner that jump-over is eliminated, thus reducing the possibility of a short circuit due to the bond wire making contact with the bus bar.

It is another advantage of the present invention to provide an LOC leadframe configuration having a reduced loop height for production of thin, small-outline packages ("TSOP"). This configuration also reduces the likelihood of the bond wire interconnect making contact with the bus bar should the bond wire become deformed and bend over the edge of the lead finger.

It is a further advantage of the present invention that the landing areas for the bond wire interconnects on the lead fingers and the bus bars are large enough to reliably form a stitch bond.

It is also an advantage of the present invention that the leadframe requires only one piece of insulative tape to adhere and insulate it from the chip below, thereby reducing the likelihood of failure during and after stress testing because there are not a number of different plastics involved, each having their own thermal properties.

It is another advantage of the present invention to provide a leadframe made of at least two different materials so that the possibility of shorts because of electrochemical conduction will be reduced.

BRIEF DESCRIPTION OF DRAWINGS

The preferred exemplary embodiments of the present invention will hereinafter be described in conjunction with the appended drawings, where like designations denote like elements, and.

BEST MODES FOR CARRYING OUT THE INVENTION

Figure 1:
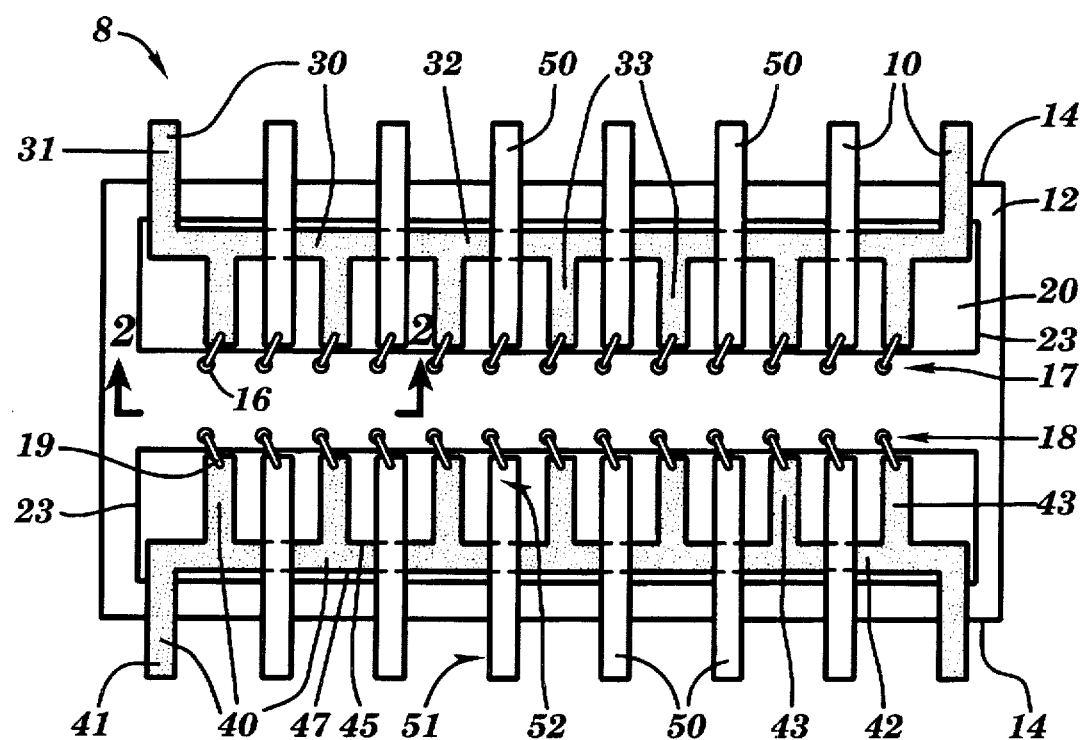
FIG. 1 is a top view of a first embodiment of the present invention.
Figure 3:
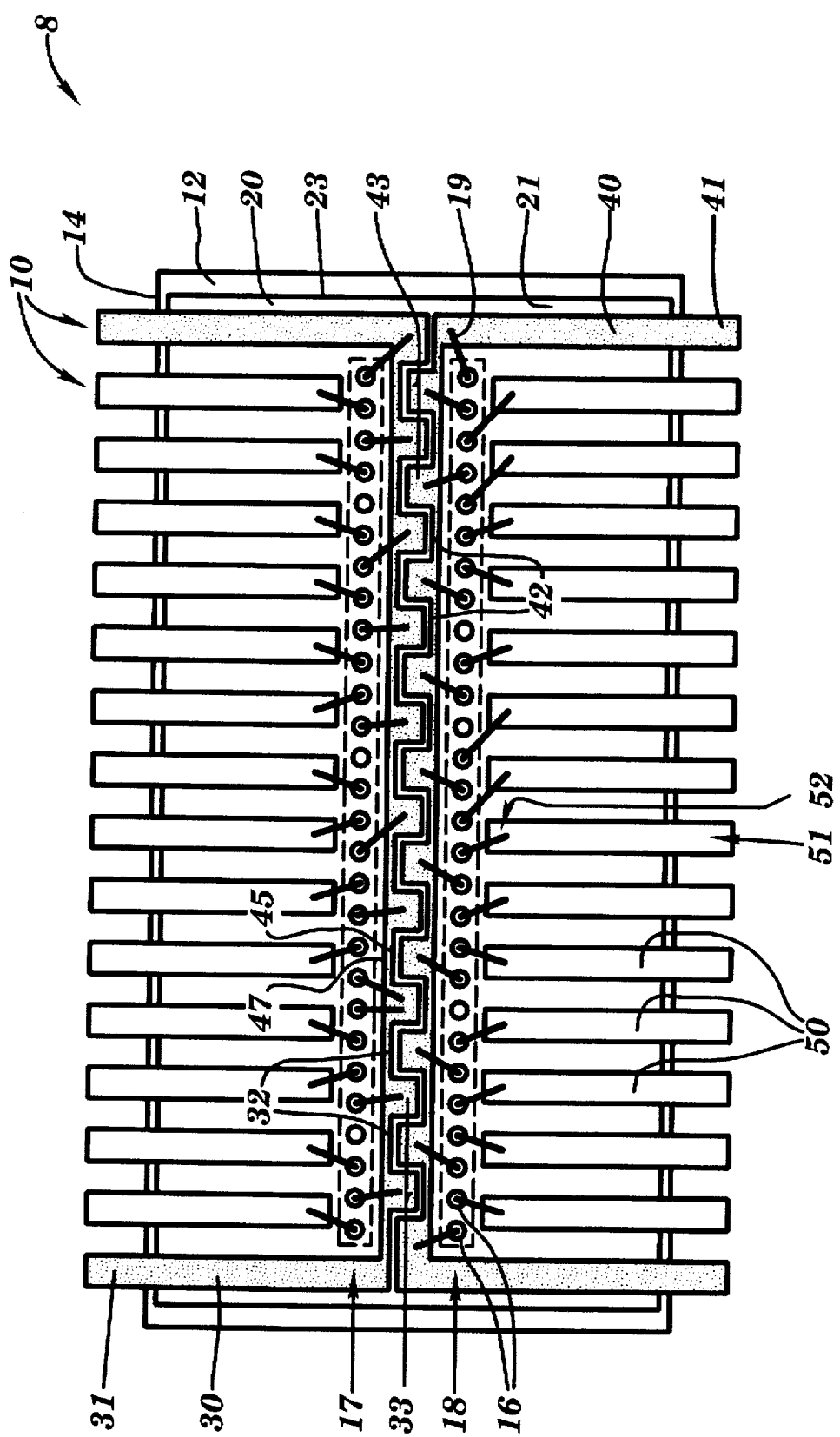
FIG. 3 is a top view of a second embodiment of the present invention.

Referring to FIGS. 1 and 3, there are shown two alternate embodiments of a semiconductor device, generally designated as 8, having a novel leadframe 10 for use in LOC packaging in TSOP packages. The leadframe 10 is mounted on an integrated circuit chip 12 having longitudinal edges 14 by means of an insulative tape 20. The insulative tape 20 has an upper surface 21, a lower surface (not shown), and two lateral edges 23. The integrated circuit chip 12 also includes a plurality of chip pads 16. The chip pads 16 may be connected to the leadframe 10, in which case the connection is made by means of a bond wire interconnect 19.

In a first embodiment, as shown in FIG. 1, the semiconductor device 8 includes a leadframe 10, connected to the chip 12 by a piece of insulative tape 20, and a first and second row, 17 and 18 respectively, of chip pads 16 extending in a parallel fashion down the center of the chip 12. Alternatively, the chip pads 16 may extend in a lateral direction, there may be four pairs of rows, or any other configuration known in the art.

The leadframe 10 comprises a plurality of lead fingers 50, each having an inner end 52 and an outer end 51. The leadframe 10 further comprises two bus bars 30, 40. A first bus bar 30 comprises first terminal ends 31, a first distribution line 32 and a plurality of first distribution finger 33.

The first distribution fingers 33 extend from proximate the first row 17 of chip pads 16 a first side or portion 45 of to the first distribution line 32, to which the first distribution fingers 33 are integrally connected and are coplanar. The first distribution line 32 runs parallel to the double row of chip pads 16 and extends to the lateral edges 23 of the insulative tape 20. The first terminal ends 31 run parallel to the first distribution fingers 33, extending from a second side or portion 47 of the first distribution line 32 to a point beyond the longitudinal edge 14 of the chip 12.

The lead fingers 50 are interposed between the first distribution fingers 33 and extend from the inner end 52, proximate the double row of chip pads 16, to a point past the longitudinal edge 14 of the chip 12 at the outer end 51.

Figure 2:
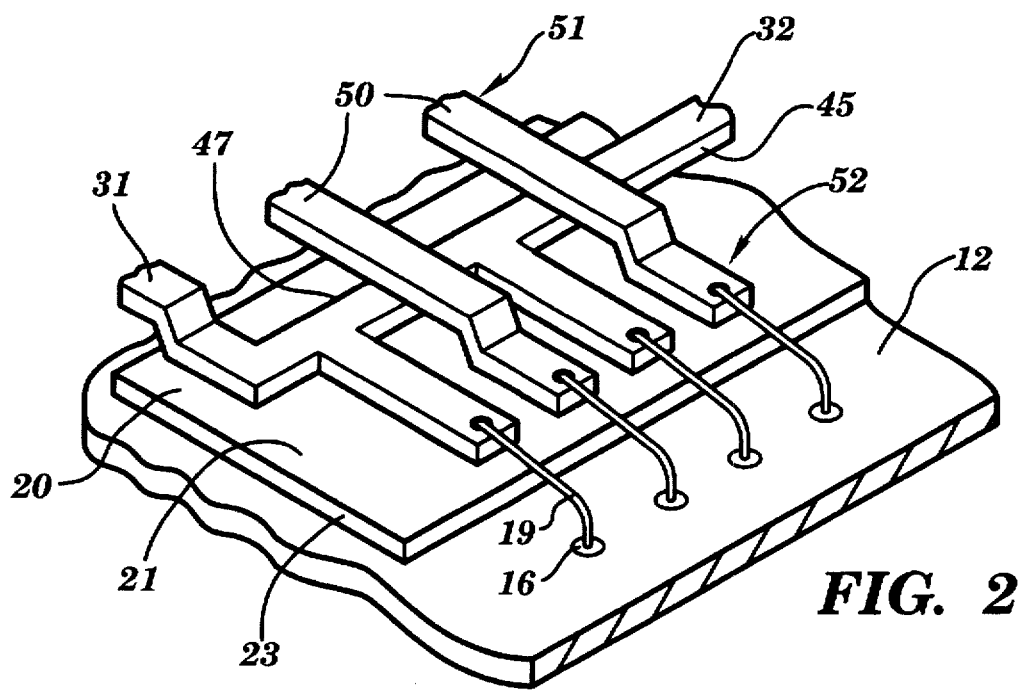
FIG. 2 is a partial isometric view of the portion of FIG. 1 indicated by the line 2—2.

As shown in FIG. 2, the first distribution fingers 33 and lead fingers 50 are coplanar at the inner edge of the tape 20, proximate the first row 17 of the chip pads 16. In order to avoid contact between the first distribution fingers 33 and the lead fingers 50, the lead fingers 50 extend out from the inner end 52, so that there is an adequate area to form the stitch bond with the bond wires 19, then upwardly at least the width of the first distribution line 32 of the bus bar 30 and then outwardly to a point beyond the longitudinal edge of the chip 12, in a stepwise fashion. The first terminal ends 31 of the first bus bar 30 are also stepped up so that they are coplanar with the outer ends 51 of the lead fingers 50 as they exit the package.

The fact that the lead fingers and the first distribution fingers are coplanar is desirable because the loop height of the bond wires 19, which may extend from the chip pads 16 to either the first distribution fingers 33 or the lead fingers 50, approaches zero. The reduction in loop height produces a concurrent reduction in the probability of the bond wire becoming pressed down and therefore coming into contact with the surface beneath the lead finger 50 or first distribution fingers 33. An additional advantage of the present invention is that, in the event that this possibility arises, the bond wires 19 would only come into contact with the insulative tape 20, rather than a bus bar running beneath the lead finger or between the lead finger and the chip pad. An advantage particular to this embodiment of the invention is a reduction in shorts arising from electrochemical currents because of the presence of the first distribution fingers 33 interposed between the lead fingers 50 serves to electrically isolate one lead finger from another. This is especially true when the voltage differences between two adjacent lead fingers exceeds the cell potential of the lead material. Further, the use of different materials for the lead fingers and the distribution fingers can act to increase the cell potential above the voltages available when the device is used.

Additionally, a second bus bar 40 is also shown in FIG. 1, which may be used for providing a second voltage to the chip 12. The second bus bar 40 comprises two second terminal ends 41, a second distribution line 42 and a plurality of second distribution fingers 43. These are connected in the same manner, but in a mirror image about the plane between the first row 17 of chip pads 16 and the second row 18, as the first bus bar 30 as described above. The second bus bar 40 is again interwoven with the lead fingers 50 in the same manner as shown in FIG. 2.

The first bus bar 30, second bus bar 40, and lead fingers 50 may all be made out of the same conductive material, each may different, or any combination thereof.

In a second embodiment, as shown in FIG. 3, the first distribution line and the second distribution line of the first and second bus bars run parallel to each other 17 and 18 between the two rows of chip pads 16 and 18. In this embodiment, the first and second distribution fingers 43 and 33 are interlocking, thus providing an adequate landing surface for the bond wires 19 to be stitched bonded to the bus bars 40 and 30 without having to move the chip pads 16 further apart and therefore having to redesign the entire semiconductor device 8.

The semiconductor device 8 in the second embodiment again comprises an integrated circuit chip 12, a lead frame 10 attached to and insulated from the chip 12 by means of an insulative tape 20, a double row of chip pads 16, and a plurality of bond wires 19 electrically connecting the chip pads 16 to the leadframe 10. The chip pads 16 may again be arranged in the double row along the longitudinal centerline, as shown in FIG. 3, or the double row may run accross the chip 12 in the lateral direction, or in any other manner as known in the art. The insulative tape 20 in this embodiment has only a small cut out areas, sufficient to expose the chip pads 16.

The leadframe 10 comprises a first bus bar 30, a second bus bar 40, and a plurality of lead fingers 50. The lead fingers 50 again extend from the inner end 52 proximate the double row chip pads 16 to the outer end 51 at the longitudinal edges 14 of the integrated chip 12. The bus bars 30 and 40 run between the first and second rows 17 and 18 of the chip pads 16. Therefore, in this embodiment, the entire leadframe 10 may be in one plane and there is no need to raise the lead fingers 50 because they do not pass over the bus bars 40 and 30.

The distribution lines 32 and 42 of the bus bars, 30 and 40 respectively are reduced in width so that the first and second distribution fingers 33 and 43, which run from a first side or portion 45 of the first and second bus bars may be increased in length to form an adequate landing area to form the stitch bond for the bond wires 19. As shown in FIG. 3, the bus bars 30 and 40 are castellated in configuration, but any interlocking structure providing an adequate landing area could be substituted. The first and second distribution lines 32 and 42 of the first and second bus bars, 30 and 40 respectively run along the first and second rows of chips towards the lateral edges 23 of the tape 20. The terminal ends 31 and 41, which are an integral portion of the bus bars, 30 and 40 respectively, run from a second side or portion 47 of the first and second bus bars parallel to the lead fingers 50 to a point beyond the longitudinal edge 14 of the chip 12.

The leadframe of the second embodiment of the invention may be produced in the manner known in the art, by passing a strip of copper down a line to be punched into the proper configuration of bus bars and lead fingers. The leadframe remains attached to the copper strip. The chip with the tape is passed under the leadframe, the tape is heated, and the leadframe is adhered to the tape in the bonding tool. Once the leadframe is attached to the tape and chip, the leadframe is cut from the strip and the entire semiconductor device is packaged.

In order to produce the leadframe of the first embodiment of the invention, the method known in the art must be adapted. Two methods of production have been suggested. First, the leadframe may be assembled in at least two passes through the bonding tool. The bus bars may be assembled by passing a strip of the desired material down a production line where it is punched into the proper configurations of the bus bars, at the terminal ends, remain attached to the strip and are adhered to the chip via the tape during a first pass through the bonding tool. Next, the lead fingers are formed by passing a second strip of material down the production line and punching and molding them into the proper configuration. The lead fingers remain attached to the strip at the outer ends and are attached to the chip via the tape during a second pass through the bonding tool. The bond wires are stitch-bonded at the appropriate sites and then the entire unit is packaged in a plastic and the outer ends of the lead fingers and terminal ends of the bus bars are bent down. If one wishes to use three separate materials, each of the bus bars would be separately punched and bonded, requiring three passes through the bonding tool.

A second method of manufacturing the semiconductor device would be to begin with a strip that is double the width of the standard strip. The lead fingers could be formed on one half and the bus bars on the other half. The strip could then be folded in half. Thereby super imposing the bus bars and lead fingers which could then be attached to the chip using only one pass through the bonding tool.

Alternatively, one wants to use three different materials one for each the first bus bar, the second bus bar and the lead finger. The first bus bar perhaps may be assembled then the second bus bar could be assembled on attached to the chip and the lead fingers would finally be placed on the chips.

While the invention has been particularly shown and described with reference to preferred exemplary embodiments thereof, it will be understood by those skilled in the art that the foregoing and other changes in form an details may be made therein without departing from the spirit and scope of the invention.

I claim:

1. Apparatus comprising:
    a plurality of chip pads;
    a leadframe; and
    a plurality of bond wires electrically coupling the chip pads to the leadframe, wherein the leadframe has at least one bus bar, each bus bar including: a primary distribution line having a terminal end extending from a first side thereof and a distribution finger extending from a second side thereof, wherein the primary distribution line and the distribution finger are coplanar, and wherein the distribution finger is adapted for electrically connecting bond wires with the primary distribution line.

2. An apparatus according to claim 1, wherein the apparatus is planar.

3. An apparatus according to claim 1, wherein the terminal end has a portion that is non-coplanar with the primary distribution line.

4. A semiconductor device comprising:
    an integrated circuit chip having a plurality of chip pads;
    an insulative tape;
    a leadframe adhered to the integrated circuit chip by means of the insulative tape; and
    a plurality of bond wires electrically coupling the chip pads to the leadframe wherein the lead frame has at least one bus bar, each bus bar including: a primary distribution line having a terminal end extending from a first side thereof and a distribution finger extending from a second side thereof, wherein the primary distribution line and the distribution finger are coplanar, and wherein the distribution finger is adapted for electrically connecting bond wires with the primary distribution line.

5. The semiconductor device of claim 4, wherein the plurality of chip pads are spaced and arranged in first and second rows, said rows being centrally disposed on the chip surface.

6. The semiconductor device of claim 5, wherein the leadframe comprises a first and a second bus bar, the primary distribution lines and distribution fingers of the first and second bus bars being interlocking and positioned between the first and second rows of chip pads.

7. The semi-conductor device of claim 6, wherein the distribution fingers of the first and second bus bars project from the primary distribution lines to form a castellated configuration.

8. The semiconductor device of claim 6, wherein the leadframe further comprises at least one lead finger, the lead finger having an inner end and an outer end.

9. The semiconductor device of claim 8, wherein the lead fingers are disposed between and parallel to the terminal ends of the bus bars.

10. The semiconductor device of claim 5, wherein the leadframe comprises at least one lead finger, the lead finger having an inner end and an outer end.

11. The semiconductor device of claim 10, wherein the inner end of the lead finger and the distribution finger of the bus bar are coplanar.

12. The semiconductor device of claim 11, wherein the outer end of the lead finger and the terminal end of the bus bar are coplanar and lie in a plane separate from and parallel to the inner end of the lead finger and the distribution finger of the bus bar.

13. The semiconductor device of claim 10, wherein the leadframe comprises a first and a second bus bar.

14. The semiconductor device of claim 13, wherein the distribution fingers of the bus bars are interposed between the lead fingers.

15. The semiconductor device of claim 13, wherein the bus bars are composed of a first conductive material and wherein the lead finger is composed of a second conductive material.

16. The semiconductor device of claim 13, wherein the first and second bus bars and the lead fingers are each composed of a different conductive material.

17. The semiconductor device of claim 15, wherein the lead fingers are coated with a conductive and corrosion resistant material.

18. An electronic apparatus comprising a semiconductor device, said semiconductor device comprising:
    an integrated circuit chip having a plurality of chip pads;
    an insulative tape;
    a leadframe adhered to the integrated circuit chip by means of the insulative tape; and
    a plurality of bond wires electrically coupling the chip pads to the leadframe, wherein the leadframe has at least one bus bar, each bus bar including: a primary distribution line having a terminal end extending from a first side thereof and a distribution finger extending from a second side thereof, wherein the primary distribution line and the distribution finger are coplanar, and wherein the distribution finger is adapted for electrically connecting bond wires with the primary distribution line.

19. The electronic apparatus of claim 18, wherein the leadframe includes a first and a second bus bar, the primary distribution lines and distribution fingers of the first and second bus bars being interlocking and positioned between the first and second rows of chip pads.

20. The electronic apparatus of claim 18, wherein the leadframe includes a first and a second bus bar, and a plurality of lead fingers, wherein the lead fingers each have an inner end and an outer end and wherein the inner ends of the lead fingers and the distribution fingers of the each of the bus bars are coplanar and wherein the outer ends of the lead fingers and the terminal ends of each of the bus bars are coplanar and lie in a plane separate from and parallel to the inner ends of the lead fingers and the distribution fingers of each of the bus bars and wherein the distribution fingers of the bus bars are interposed between the lead fingers.

* * * * *